United States Patent
Zhang

(10) Patent No.: US 11,782,317 B2
(45) Date of Patent: Oct. 10, 2023

(54) ARRAY SUBSTRATE AND LIQUID CRYSTAL DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventor: Yihe Zhang, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 439 days.

(21) Appl. No.: 17/050,423

(22) PCT Filed: Jul. 9, 2020

(86) PCT No.: PCT/CN2020/101019
§ 371 (c)(1),
(2) Date: Oct. 23, 2020

(87) PCT Pub. No.: WO2021/227228
PCT Pub. Date: Nov. 18, 2021

(65) Prior Publication Data
US 2023/0109769 A1    Apr. 13, 2023

(30) Foreign Application Priority Data

May 13, 2020    (CN) .......................... 202010403672.2

(51) Int. Cl.
G02F 1/1368    (2006.01)
G02F 1/1343    (2006.01)
(Continued)

(52) U.S. Cl.
CPC ...... *G02F 1/134345* (2021.01); *G02F 1/1337* (2013.01); *G02F 1/1368* (2013.01);
(Continued)

(58) Field of Classification Search
CPC .................................................... G02F 1/1368
See application file for complete search history.

(56) References Cited

U.S. PATENT DOCUMENTS

2009/0033608 A1* 2/2009 Kim .................. G02F 1/1345
345/92
2017/0293185 A1* 10/2017 Park .................. G02F 1/133753

FOREIGN PATENT DOCUMENTS

CN    101359141 A    2/2009
CN    105278191 A    1/2016
(Continued)

*Primary Examiner* — Sang V Nguyen
(74) *Attorney, Agent, or Firm* — PV IP PC; Wei Te Chung; Zhigang Ma

(57) ABSTRACT

An array substrate and a liquid crystal display panel are provided. The array substrate includes a substrate, a thin film transistor layer disposed on the substrate, and a pixel electrode disposed on the thin film transistor layer. The thin film transistor layer includes a plurality of data lines. The pixel electrode includes a first trunk electrode and a second trunk electrode. Portions of the data line corresponding to the first trunk electrode and the second trunk electrode overlap or partially overlap with the first trunk electrode and the second trunk electrode.

15 Claims, 2 Drawing Sheets

(51) Int. Cl.
*G02F 1/1337* (2006.01)
*G02F 1/1362* (2006.01)
*H01L 27/12* (2006.01)

(52) U.S. Cl.
CPC ...... *G02F 1/136286* (2013.01); *H01L 27/124* (2013.01); *G02F 2201/40* (2013.01)

(56) References Cited

FOREIGN PATENT DOCUMENTS

| | | |
|---|---|---|
| CN | 105785683 A | 7/2016 |
| CN | 107015403 A | 8/2017 |
| CN | 109634012 A | 4/2019 |
| CN | 110824789 A | 2/2020 |
| KR | 20170097263 A | 8/2017 |

* cited by examiner

ARRAY SUBSTRATE AND LIQUID CRYSTAL DISPLAY PANEL

RELATED APPLICATIONS

This application is a Notional Phase of PCT Patent Application No. PCT/CN2020/101019 having international filing date of Jul. 9, 2020, which claims the benefit of priority of Chinese Patent Application No. 202010403672.2 filed on May 13, 2020. The contents of the above applications are all incorporated by reference as if fully set forth herein in their entirety.

FIELD OF DISCLOSURE

The present disclosure relates to the field of display technologies, in particular to an array substrate and a liquid crystal display panel.

BACKGROUND

A liquid crystal display panel is usually composed of a color filter substrate, a thin film transistor array substrate, and a liquid crystal layer disposed between the two substrates. The liquid crystal display panels include a twisted nematic (TN) mode, an electronically controlled birefringence (ECB) mode, a vertical alignment (VA) mode, and other display modes. The VA mode is a common display mode with advantages of high contrast, wide viewing angles, and no need for rubbing alignment. However, because the VA mode adopts a vertically rotating liquid crystal, a difference in a birefringence of the liquid crystal molecules is relatively large, resulting in a serious color shift under large viewing angles.

At present, in order to improve a viewing angle performance of the panel, a polymer-stabilized vertical alignment (PSVA) pixel design of 3T-8 domains (including 8 domains and 3 transistors) is usually employed. In the 3T-8 domains (including 8 domains and 3 transistors), a display panel with a VA pixel structure driven by 3 thin film transistors (TFTs) is required. Although this design can increase the viewing angles, it will decrease an aperture. Moreover, a backlight is required to provide higher brightness, thereby increasing energy consumption.

SUMMARY OF DISCLOSURE

The present disclosure provides an array substrate and a display panel to increase a driving voltage in a sub-region of a pixel electrode. Also, a pixel aperture and transmittance are increased, so as to reduce energy consumption of the display panel.

In order to achieve the above functions, the present disclosure provides technical solutions as follows.

An array substrate includes a substrate, a thin film transistor layer disposed on the substrate, and a pixel electrode disposed on the thin film transistor layer.

The thin film transistor layer includes a thin film transistor, a plurality of scan lines extending in a horizontal direction, and a plurality of data lines extending in a vertical direction.

The array substrate includes a plurality of sub-pixel regions, and each of the sub-pixel regions includes a main region and a sub-region.

The pixel electrode corresponds to the main region and the sub-region, and the pixel electrode includes a first trunk electrode corresponding to the main region and a second trunk electrode corresponding to the sub-region.

One of the data lines corresponds to the first trunk electrode and the second trunk electrode, and portions of the data line corresponding to the first trunk electrode and the second trunk electrode overlap or partially overlap with the first trunk electrode and the second trunk electrode.

In the array substrate of the present disclosure, the sub-pixel regions are divided into eight liquid crystal alignment regions by the first trunk electrode and the second trunk electrode.

The main region includes a first dark area disposed between two of the liquid crystal alignment regions and overlapping or partially overlapping with the first trunk electrode, and the sub-region includes a second dark area disposed between two of the liquid crystal alignment regions and overlapping or partially overlapping with the second trunk electrode.

In the array substrate of the present disclosure, a portion of the data line corresponding to the first trunk electrode overlaps with the first dark area.

A portion of the data line corresponding to the second trunk electrode overlaps with the second dark area.

In the array substrate of the present disclosure, the first trunk electrode includes a first sub-trunk electrode and a second sub-trunk electrode which are arranged perpendicularly to each other, and the second trunk electrode includes a third sub-trunk electrode and a fourth sub-trunk electrode which are arranged perpendicularly to each other.

The main region is divide into four liquid crystal alignment regions by the first sub-trunk electrode and the second sub-trunk electrode, and the sub-region is divide into four liquid crystal alignment regions by the third sub-trunk electrode and the fourth sub-trunk electrode.

In the array substrate of the present disclosure, a portion of the data line corresponding to the first sub-trunk electrode overlaps or partially overlaps with the first sub-trunk electrode, and a portion of the data line corresponding to the third sub-trunk electrode overlaps or partially overlaps with the third sub-trunk electrode.

In the array substrate of the present disclosure, each of the sub-pixel regions is provided with one thin film transistor, the thin film transistor is disposed between the main region and the sub-region, a drain of the thin film transistor is connected to a pixel electrode of the main region and a pixel electrode of the sub-region, and a source of the thin film transistor is connected to one of the data lines.

In the array substrate of the present disclosure, the pixel electrode further includes a first branch electrode corresponding to the main region and a second branch electrode corresponding to the sub-region. The first branch electrode and the first trunk electrode are electrically connected at a first predetermined angle, the second branch electrode and the second trunk electrode are electrically connected at a second predetermined angle, and the first predetermined angle is different from the second predetermined angle.

In the array substrate of the present disclosure, first predetermined angles between the corresponding first branch electrode and the first trunk electrode of two adjacent sub-pixel regions are the same.

Second predetermined angles between the corresponding second branch electrode and the second trunk electrode of two adjacent sub-pixel regions are different, or the second predetermined angles between the corresponding second branch electrode and the second trunk electrode of two adjacent sub-pixel regions are the same.

In the array substrate of the present disclosure, the first predetermined angle ranges from 10° to 45°, and the second predetermined angle ranges from 5° to 15°.

The present disclosure liquid crystal provides a display panel, including any one of the above-mentioned array substrate and color film substrate, an opposite substrate opposite to the array substrate, and a liquid crystal layer disposed between the array substrate and the opposite substrate.

In the liquid crystal display panel of the present disclosure, the array substrate includes a plurality of sub-pixel regions, and each of the sub-pixel regions includes a main region and a sub-region. The pixel electrode corresponds to the main region and the sub-region, and the pixel electrode includes a first trunk electrode corresponding to the main region and a second trunk electrode corresponding to the sub-region.

One of the data lines corresponds to the first trunk electrode and the second trunk electrode, and portions of the data line corresponding to the first trunk electrode and the second trunk electrode overlap or partially overlap with the first trunk electrode and the second trunk electrode.

An array substrate includes a substrate, a thin film transistor layer disposed on the substrate, and a pixel electrode disposed on the thin film transistor layer.

The thin film transistor layer includes a thin film transistor, a plurality of scan lines extending in a horizontal direction, and a plurality of data lines extending in a vertical direction.

The array substrate includes a plurality of sub-pixel regions, and each of the sub-pixel regions includes a main region and a sub-region.

The pixel electrode corresponds to the main region and the sub-region, and the pixel electrode includes a first trunk electrode corresponding to the main region and a second trunk electrode corresponding to the sub-region.

The sub-pixel regions are divided into eight liquid crystal alignment regions by the first trunk electrode and the second trunk electrode.

The main region includes a first dark area disposed between two of the liquid crystal alignment regions and overlapping or partially overlapping with the first trunk electrode, and the sub-region includes a second dark area disposed between two of the liquid crystal alignment regions and overlapping or partially overlapping with the second trunk electrode.

One of the data lines corresponds to the first trunk electrode and the second trunk electrode, and portions of the data line corresponding to the first trunk electrode and the second trunk electrode overlap or partially overlap with the first trunk electrode and the second trunk electrode.

In the array substrate of the present disclosure, a portion of the data line corresponding to the first trunk electrode overlaps with the first dark area.

A portion of the data line corresponding to the second trunk electrode overlaps with the second dark area.

In the array substrate of the present disclosure, the first trunk electrode includes a first sub-trunk electrode and a second sub-trunk electrode which are arranged perpendicularly to each other, and the second trunk electrode includes a third sub-trunk electrode and a fourth sub-trunk electrode which are arranged perpendicularly to each other.

The main region is divide into four liquid crystal alignment regions by the first sub-trunk electrode and the second sub-trunk electrode, and the sub-region is divide into four liquid crystal alignment regions by the third sub-trunk electrode and the fourth sub-trunk electrode.

In the array substrate of the present disclosure, a portion of the data line corresponding to the first sub-trunk electrode overlaps or partially overlaps with the first sub-trunk electrode, and a portion of the data line corresponding to the third sub-trunk electrode overlaps or partially overlaps with the third sub-trunk electrode.

In the array substrate of the present disclosure, each of the sub-pixel regions is provided with one thin film transistor, the thin film transistor is disposed between the main region and the sub-region, a drain of the thin film transistor is connected to a pixel electrode of the main region and a pixel electrode of the sub-region, and a source of the thin film transistor is connected to one of the data lines.

In the array substrate of the present disclosure, the pixel electrode further includes a first branch electrode corresponding to the main region and a second branch electrode corresponding to the sub-region. The first branch electrode and the first trunk electrode are electrically connected at a first predetermined angle, the second branch electrode and the second trunk electrode are electrically connected at a second predetermined angle, and the first predetermined angle is different from the second predetermined angle.

In the array substrate of the present disclosure, first predetermined angles between the corresponding first branch electrode and the first trunk electrode of two adjacent sub-pixel regions are the same.

Second predetermined angles between the corresponding second branch electrode and the second trunk electrode of two adjacent sub-pixel regions are different, or the second predetermined angles between the corresponding second branch electrode and the second trunk electrode of two adjacent sub-pixel regions are the same.

In the array substrate of the present disclosure, the first predetermined angle ranges from 10° to 45°, and the second predetermined angle ranges from 5° to 15°.

BRIEF DESCRIPTION OF DRAWINGS

In the following, with reference to the accompanying drawings, the technical solutions and other beneficial effects of the present disclosure will be made obvious by describing in detail the specific embodiments of the present disclosure.

DETAILED DESCRIPTION

The present disclosure provides and array substrate and a display panel. In order to more clearly describe the purposes, the technical solutions, and the effects of the present disclosure, accompanying drawings to be used in the detailed description of the disclosure will be briefly described hereinbelow. It should be understood that the specific embodiments described herein are only used to explain the present disclosure, and are not used to limit the present disclosure.

Figure 1:
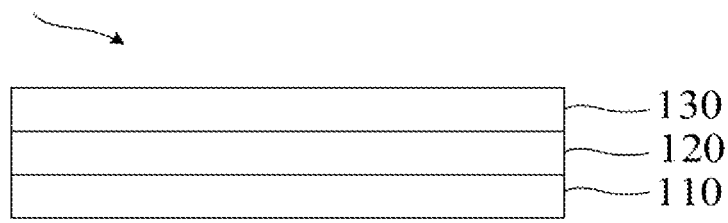
FIG. 1 is a schematic diagram of an array substrate of the present disclosure.

FIG. 1 is a schematic diagram of an array substrate of the present disclosure.

The present disclosure provides an array substrate 100. The array substrate 100 includes a substrate 110, a thin film transistor layer 120 disposed on the substrate 110, and a pixel electrode layer 130 disposed on the thin film transistor layer 120.

Figure 2:
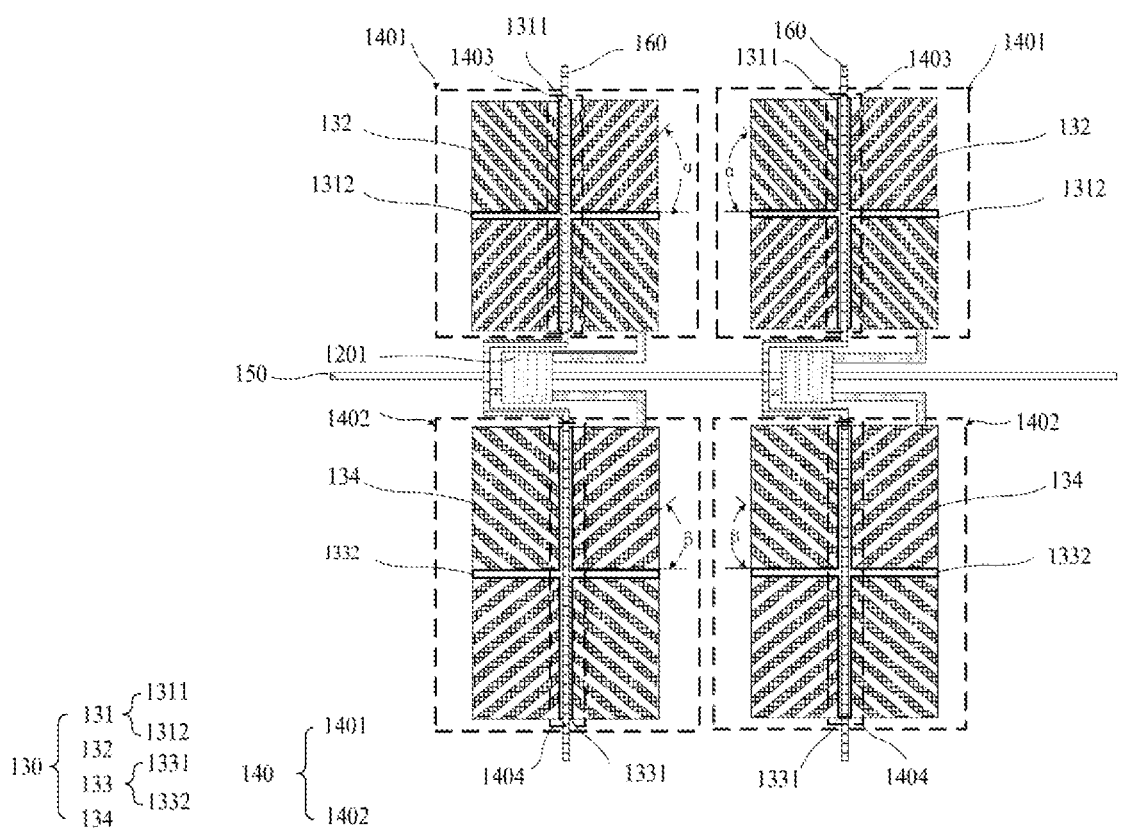
FIG. 2 is a top view of a pixel region of the array substrate of the present disclosure.

FIG. 2 is a top view of a pixel region of the array substrate of the present disclosure.

In the present disclosure, the thin film transistor layer 120 includes thin film transistors 1201, a plurality of scan lines 150 extending in a horizontal direction, and a plurality of data lines 160 extending in a vertical direction.

In the present disclosure, the array substrate 100 includes a plurality of sub-pixel regions 140, and each of the sub-pixel regions 140 includes a main region 1401 and a sub-region 1402.

In the present disclosure, the pixel electrode 130 is disposed corresponding to the main region 1401 and the sub-region 1402.

An area of the main region 1401 is less than or equal to an area of the sub-region 1402, which is not limited by the present disclosure.

In the present disclosure, the thin film transistor 1201 is disposed between the main region 1401 and the sub-region 1402. A drain of the thin film transistor 1201 is connected to the pixel electrode 130 of the main region 1401 and the pixel electrode 130 of the sub-region 1402. A source of the thin film transistor 1201 is connected to the data line 160.

In the present disclosure, the pixel electrode 130 includes a first trunk electrode 131 corresponding to the main region 1401 and a second trunk electrode 133 corresponding to the sub-region 1402.

One of the data lines 160 correspond to the first trunk electrode 131 and the second trunk electrode 133. A portion of the data line 160 corresponding to the first trunk electrode 131 and the second trunk electrode 133 overlaps or partially overlaps with the first trunk electrode 131 and the second trunk electrode 133, and the present disclosure does not limit this.

In the present disclosure, one of the data lines 160 corresponds to the first trunk electrode 131 and the second trunk electrode 133, and the portions of the data line 160 corresponding to the first trunk electrode 131 and the second trunk electrode 133 overlap or partially overlap with the first trunk electrode 131 and the second trunk electrode 133, such that an aperture of the pixel is increased and a transmittance is increased.

In the present disclosure, the sub-pixel regions 140 is divided into eight liquid crystal alignment regions by the first trunk electrode 131 and the second trunk electrode 133.

The main region 1401 includes a first dark area 1403 disposed between two of the liquid crystal alignment regions and overlapping or partially overlapping with the first trunk electrode 131, and the sub-region 1402 includes a second dark area 1404 disposed between two of the liquid crystal alignment regions and overlapping or partially overlapping with the second trunk electrode 133, and which is not limited by the present disclosure.

In the present disclosure, a portion of the data line 160 corresponding to the first trunk electrode 131 overlaps with the first dark area 1403.

A portion of the data line 160 corresponding to the second trunk electrode 133 overlaps with the second dark area 1404.

Furthermore, in the present disclosure, the first trunk electrode 131 includes a first sub-trunk electrode 1311 and a second sub-trunk electrode 1312 which are arranged perpendicularly to each other, and the second trunk electrode 133 includes a third sub-trunk electrode 1331 and a fourth sub-trunk electrode 1332 which are arranged perpendicularly to each other.

The first sub-trunk electrode 1311 and the second sub-trunk electrode 1312 are disposed in a middle region of the main region 1401. The third sub-trunk electrode 1331 and the fourth sub-trunk electrode 1332 are disposed in a middle region of the sub-region 1402.

The main region 1401 is divide into four liquid crystal alignment regions by the first sub-trunk electrode 1311 and the second sub-trunk electrode 1312, and the sub-region 1402 is divide into four liquid crystal alignment regions by the third sub-trunk electrode 1331 and the fourth sub-trunk electrode 1332.

In the present disclosure, a portion of the data line 160 corresponding to the first sub-trunk electrode 1311 overlaps or partially overlaps with the first sub-trunk electrode 1311.

A portion of the data line 160 corresponding to the third sub-trunk electrode 1331 overlaps or partially overlaps with the third sub-trunk electrode 1331.

In the present disclosure, the pixel electrode 130 also includes a first branch electrode 132 corresponding to the main region 1401 and a second branch electrode 134 corresponding to the sub-region 1402.

In the present disclosure, two first branch electrodes 132 in any one of the liquid crystal alignment regions of the main region 1401 are parallel to each other. Two second branch electrodes 134 in any one of the liquid crystal alignment regions of the sub-region 1402 are parallel to each other.

In the present disclosure, the first branch electrode 132 is electrically connected to the first sub-trunk electrode 1311 or the second sub-trunk electrode 1322 at a first predetermined angle $\alpha$. The second branch electrode 134 is electrically connected to the third sub-trunk electrode 1331 or the fourth sub-trunk electrode 1332 at a second predetermined angle $\beta$. The first predetermined angle $\alpha$ is different from the second predetermined angle $\beta$.

In the present disclosure, first predetermined angles $\alpha$ between the corresponding first branch electrode 132 and the first trunk electrode 131 of two adjacent sub-pixel regions 130 are the same.

Second predetermined angles $\beta$ between the corresponding second branch electrode 134 and the second trunk electrode 133 of two adjacent sub-pixel regions 130 are different. Alternatively, the second predetermined angles $\beta$ between the corresponding second branch electrode 134 and the second trunk electrode 133 of two adjacent sub-pixel regions 130 are the same, and which is not limited by the present disclosure.

In the present disclosure, the first predetermined angles $\alpha$ between the corresponding first branch electrode 132 and the first trunk electrode 131 of two adjacent sub-pixel regions 130 and the second predetermined angles $\beta$ between the corresponding second branch electrode 134 and the second trunk electrode 133 of two adjacent sub-pixel regions 130 are different.

In the present disclosure, the first branch electrode 132 and the first trunk electrode 131 are electrically connected at the first predetermined angle $\alpha$, and the second branch electrode 134 and the second trunk electrode 133 are electrically connected at the second predetermined angle $\beta$. By setting the first predetermined angle $\alpha$ to be different from the second predetermined angle $\beta$, the liquid crystal display panel has advantages of wide viewing angles. Also, in the present disclosure, by using one thin film transistor 120 to drive the pixel electrode 130 of the main region 1401 and the pixel electrode 130 of the sub-region 1402, the number of thin film transistors 120 in the prior art is reduced, and the aperture and transmittance of the pixel are increased. Moreover, since a thin film transistor 120 that originally drives the sub-region 1402 of the pixel electrode 130 is omitted, a DC driving voltage is omitted, thereby effectively reducing the energy consumption of the liquid crystal display panel.

The technical solutions of the present disclosure will now be described in conjunction with specific embodiments.

Figure 3:
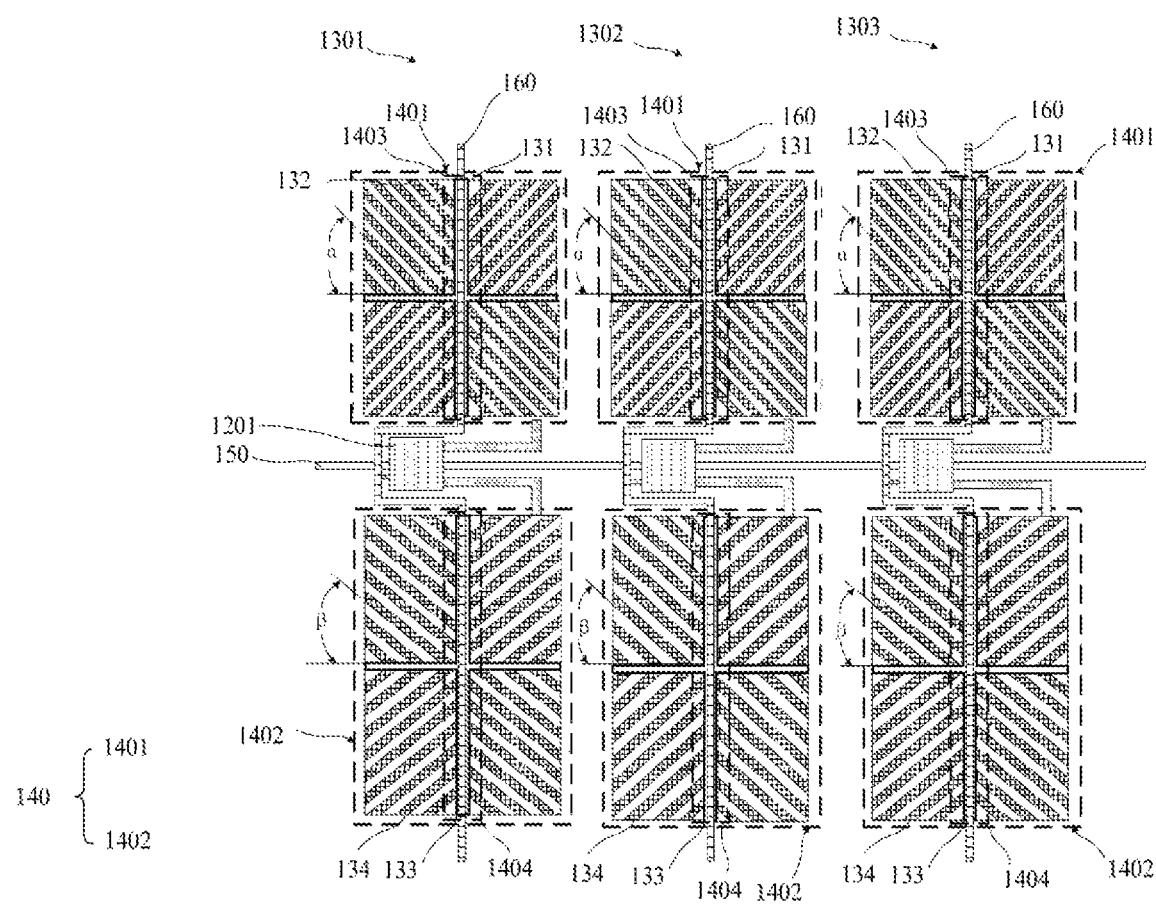
FIG. 3 is a top view of a pixel region of an array substrate of an embodiment of the present disclosure.

FIG. 3 is a top view of a pixel region of an array substrate of an embodiment of the present disclosure.

In this embodiment, a plurality of sub-pixel regions 130 include a red sub-pixel region 1301 corresponding to a red sub-pixel, a green sub-pixel region 1302 corresponding to a green sub-pixel, and a blue sub-pixel region 1303 corresponding to a blue sub-pixel.

A thin film transistor layer 120 includes thin film transistors 121 and a plurality of scan lines 150 extending along a horizontal direction and a plurality of data lines 160 extending along a vertical direction.

In this embodiment, the data lines 160 correspond to first trunk electrodes 131 and second trunk electrodes 133 of the red sub-pixel region 1301, the green sub-pixel region 1302, and the blue sub-pixel region 1303. A portion of the data lines 160 corresponding to the first trunk electrodes 131 and the second trunk electrodes 133 overlaps or partially overlaps with the first trunk electrodes 131 and the second trunk electrodes 133, which is not limited by the present disclosure.

In this embodiment, first predetermined angles α between the first branch electrodes 132 and the first trunk electrodes 131 and the corresponding red sub-pixel region 1301, the corresponding green sub-pixel region 1302, and the corresponding blue sub-pixel region 1303 are the same.

Second predetermined angles β between the second branch electrode 134 and the second trunk electrode 133 and the corresponding red sub-pixel region 1301, the corresponding green sub-pixel region 1302, and the corresponding blue sub-pixel region 1303 are different. Alternatively, the second predetermined angles β between the second branch electrode 134 and the second trunk electrode 133 and the corresponding red sub-pixel region 1301, the corresponding green sub-pixel region 1302, and the corresponding blue sub-pixel region 1303 are the same, and which is not limited by the present disclosure.

Furthermore, in this embodiment, the second predetermined angle β is less than the first predetermined angle α.

In this embodiment, the first predetermined angle α ranges from 10° to 45°, and the second predetermined angle β ranges from 5° to 15°.

Furthermore, the first predetermined angle α is 45°, and the second predetermined angle β is 30°.

It should be noted that, in this embodiment, the first predetermined angle α of 45° and the second predetermined angle β of 30° are only used for illustration and are not limited here.

In this embodiment, by setting the data lines 160 in a middle of the sub-pixel regions 140, and the portion of the data lines 160 corresponding to the first trunk electrode 131 and the second trunk electrode 133 overlaps or partially overlaps with the first trunk electrode 131 and the second trunk electrode 133 such that the aperture the transmittance of the pixel are increased. Also, since the second predetermined angles β between the second branch electrode 134 and the second trunk electrode 133 of two adjacent sub-pixel regions 130 are different, viewing angles of the sub-region 1402 of the sub-pixel regions 130 are compensated, so the liquid crystal display panel has advantages of wide viewing angles. By reducing the number of thin film transistors in the prior art, the aperture and transmittance of the pixel are increased, thereby effectively reducing the energy consumption of the display panel.

The present disclosure liquid crystal provides a liquid crystal display panel, including the array substrate 100 described in the embodiments, an opposite substrate opposite to the array substrate 100, and a liquid crystal layer disposed between the array substrate and the opposite substrate.

The array substrate 100 includes a plurality of sub-pixel regions 130, and each of the sub-pixel regions 130 includes a main region 1401 and a sub-region 1402. The pixel electrode 130 corresponds to the main region 1401 and the sub-region 1402, and the pixel electrode 160 includes a first trunk electrode 131 corresponding to the main region 1401 and a second trunk electrode 133 corresponding to the sub-region 1402.

Each of the main region 1401 and the sub-region 1402 corresponds to four liquid crystal alignment regions.

One of the data lines 160 corresponds to the first trunk electrode 131 and the second trunk electrode 133, and portions of the data line 160 corresponding to the first trunk electrode 131 and the second trunk electrode 133 overlap or partially overlap with the first trunk electrode 131 and the second trunk electrode 133, and which is not limited by the present disclosure.

Rotation angles of the liquid crystal molecules above the two adjacent liquid crystal alignment regions are different, so that the liquid crystal display panel has advantages of wide viewing angles.

The present disclosure provides an array substrate and a liquid crystal display panel. The array substrate includes a substrate, a thin film transistor layer disposed on the substrate, and a pixel electrode disposed on the thin film transistor layer. The thin film transistor layer includes a thin film transistor, a plurality of scan lines extending in a horizontal direction, and a plurality of data lines extending in a vertical direction. The array substrate includes a plurality of sub-pixel regions, and each of the sub-pixel regions includes a main region and a sub-region. The pixel electrode corresponds to the main region and the sub-region, and the pixel electrode includes a first trunk electrode corresponding to the main region and a second trunk electrode corresponding to the sub-region. One of the data lines correspond to the first trunk electrode and the second trunk electrode. A portion of the data line corresponding to the first trunk electrode and the second trunk electrode overlaps or partially overlaps with the first trunk electrode and the second trunk electrode.

In the present disclosure, a portion of the data line corresponding to the first trunk electrode overlaps with a first dark area, and a portion of the data line corresponding to the second trunk electrode overlaps with a second dark area, so that an aperture and transmittance of the pixel are increased. Moreover, by controlling an angle of the pixel electrode, the aperture of the pixel is increased, and the transmittance is increased. The number of thin film transistors in the prior art is reduced, electric leakage of pixels is avoided, and the display panel can maintain a higher voltage value and increase brightness. Also, a DC driving voltage is omitted, so it can effectively reduce energy consumption of the display panel. Furthermore, different angles of the pixel electrodes in adjacent sub-pixels can make the liquid crystal display panel having advantages of wide viewing angles.

It can be understood that, for those of ordinary skill in the art, equivalent replacements or changes can be made according to the technical solutions of the present disclosure and its inventive concept. All these changes or replacements shall fall within the protection scope of the claims attached to the present disclosure.

What is claimed is:

1. An array substrate, comprising: a substrate, a thin film transistor layer disposed on the substrate, and a plurality of pixel electrodes disposed on the thin film transistor layer;

wherein the thin film transistor layer comprises a plurality of thin film transistors, a plurality of scan lines extending in a horizontal direction, and a plurality of data lines extending in a vertical direction;

wherein the array substrate comprises a plurality of sub-pixel regions, and each of the sub-pixel regions comprises a main region and a sub-region;

wherein each of the pixel electrodes corresponds to the main region and the sub-region of a same one of the sub-pixel regions, and each of the pixel electrodes comprises a first trunk electrode corresponding to the main region and a second trunk electrode corresponding to the sub-region; and wherein one of the data lines corresponds to the first trunk electrode and the second trunk electrode, and portions of the data line corresponding to the first trunk electrode and the second trunk electrode overlap or partially overlap with the first trunk electrode and the second trunk electrode;

wherein each of the sub-pixel regions is provided with one of the thin film transistors, each of the thin film transistors are disposed between a corresponding main region and a corresponding sub-region, a drain of each of the thin film transistors is simultaneously and directly connected to a part of one of the pixel electrodes corresponding to the main region and a part of one of the pixel electrodes corresponding to the sub-region, and a source of each of the thin film transistors is connected to corresponding one of the data lines.

2. The array substrate as claimed in claim 1, wherein a portion of the data line corresponding to the first trunk electrode overlaps with a first dark area; and a portion of the data line corresponding to the second trunk electrode overlaps with a second dark area.

3. The array substrate as claimed in claim 1, wherein the first trunk electrode comprises a first sub-trunk electrode and a second sub-trunk electrode which are arranged perpendicularly to each other, and the second trunk electrode comprises a third sub-trunk electrode and a fourth sub-trunk electrode which are arranged perpendicularly to each other; and the main region is divide into four liquid crystal alignment regions by the first sub-trunk electrode and the second sub-trunk electrode, and the sub-region is divide into four liquid crystal alignment regions by the third sub-trunk electrode and the fourth sub-trunk electrode.

4. The array substrate as claimed in claim 3, wherein a portion of the data line corresponding to the first sub-trunk electrode overlaps or partially overlaps with the first sub-trunk electrode, and a portion of the data line corresponding to the third sub-trunk electrode overlaps or partially overlaps with the third sub-trunk electrode.

5. The array substrate as claimed in claim 1, wherein each of the pixel electrodes further comprises a first branch electrode corresponding to the main region and a second branch electrode corresponding to the sub-region, wherein the first branch electrode and the first trunk electrode are electrically connected at a first predetermined angle, the second branch electrode and the second trunk electrode are electrically connected at a second predetermined angle, and the first predetermined angle is different from the second predetermined angle.

6. The array substrate as claimed in claim 5, wherein first predetermined angles between the corresponding first branch electrode and the first trunk electrode of two adjacent sub-pixel regions are the same; and second predetermined angles between the corresponding second branch electrode and the second trunk electrode of two adjacent sub-pixel regions are different, or the second predetermined angles between the corresponding second branch electrode and the second trunk electrode of two adjacent sub-pixel regions are the same.

7. The array substrate as claimed in claim 6, wherein the first predetermined angle ranges from 10° to 45°, and the second predetermined angle ranges from 5° to 15°.

8. A liquid crystal display panel, comprising the array substrate as claimed in claim 1, an opposite substrate opposite to the array substrate, and a liquid crystal layer disposed between the array substrate and the opposite substrate.

9. An array substrate, comprising: a substrate, a thin film transistor layer disposed on the substrate, and a plurality of pixel electrodes disposed on the thin film transistor layer;

wherein the thin film transistor layer comprises a plurality of thin film transistors, a plurality of scan lines extending in a horizontal direction, and a plurality of data lines extending in a vertical direction;

wherein the array substrate comprises a plurality of sub-pixel regions, and each of the sub-pixel regions comprises a main region and a sub-region;

wherein each of the pixel electrodes corresponds to the main region and the sub-region of a same one of the sub-pixel regions, and each of the pixel electrodes comprises a first trunk electrode corresponding to the main region and a second trunk electrode corresponding to the sub-region;

wherein the sub-pixel regions are divided into eight liquid crystal alignment regions by the first trunk electrode and the second trunk electrode;

the main region comprises a first dark area disposed between two of the liquid crystal alignment regions and overlapping or partially overlapping with the first trunk electrode, and the sub-region comprises a second dark area disposed between two of the liquid crystal alignment regions and overlapping or partially overlapping with the second trunk electrode; and wherein one of the data lines corresponds to the first trunk electrode and the second trunk electrode, and portions of the data line corresponding to the first trunk electrode and the second trunk electrode overlap or partially overlap with the first trunk electrode and the second trunk electrode;

wherein each of the sub-pixel regions is provided with one of the thin film transistors, each of the thin film transistors are disposed between a corresponding main region and a corresponding sub-region, a drain of each of the thin film transistors is simultaneously and directly connected to a part of one of the pixel electrodes corresponding to the main region and a part of one of the pixel electrodes corresponding to the sub-region, and a source of each of the thin film transistors is connected to corresponding one of the data lines.

10. The array substrate as claimed in claim 9, wherein a portion of the data line corresponding to the first trunk electrode overlaps with the first dark area; and a portion of the data line corresponding to the second trunk electrode overlaps with the second dark area.

11. The array substrate as claimed in claim 9, wherein the first trunk electrode comprises a first sub-trunk electrode and a second sub-trunk electrode which are arranged perpendicularly to each other, and the second trunk electrode comprises a third sub-trunk electrode and a fourth sub-trunk electrode which are arranged perpendicularly to each other; and the main region is divide into four liquid crystal alignment regions by the first sub-trunk electrode and the second sub-trunk electrode, and the sub-region is divide into four liquid crystal alignment regions by the third sub-trunk electrode and the fourth sub-trunk electrode.

12. The array substrate as claimed in claim 11, wherein a portion of the data line corresponding to the first sub-trunk electrode overlaps or partially overlaps with the first sub-trunk electrode, and a portion of the data line corresponding to the third sub-trunk electrode overlaps or partially overlaps with the third sub-trunk electrode.

13. The array substrate as claimed in claim 9, wherein each of the pixel electrode further comprises a first branch electrode corresponding to the main region and a second branch electrode corresponding to the sub-region, wherein the first branch electrode and the first trunk electrode are electrically connected at a first predetermined angle, the second branch electrode and the second trunk electrode are electrically connected at a second predetermined angle, and the first predetermined angle is different from the second predetermined angle.

14. The array substrate as claimed in claim 13, wherein first predetermined angles between the corresponding first branch electrode and the first trunk electrode of two adjacent sub-pixel regions are the same; and second predetermined angles between the corresponding second branch electrode and the second trunk electrode of two adjacent sub-pixel regions are different, or the second predetermined angles between the corresponding second branch electrode and the second trunk electrode of two adjacent sub-pixel regions are the same.

15. The array substrate as claimed in claim 14, wherein the first predetermined angle ranges from 10° to 45°, and the second predetermined angle ranges from 5° to 15°.

* * * * *